United States Patent [19]

Varker

[11] Patent Number: 4,554,405
[45] Date of Patent: Nov. 19, 1985

[54] HIGH DENSITY ENCAPSULATED WIRE CIRCUIT BOARD

[75] Inventor: Kenneth J. Varker, Binghamton, N.Y.

[73] Assignee: International Business Machines Corporation, Armonk, N.Y.

[21] Appl. No.: 659,485

[22] Filed: Oct. 10, 1984

Related U.S. Application Data

[63] Continuation-in-part of Ser. No. 392,996, Jun. 28, 1982, abandoned.

[51] Int. Cl.$^4$ .............................................. H05K 1/03
[52] U.S. Cl. ................................. 174/68.5; 361/406; 361/414
[58] Field of Search ............... 174/68.5; 361/406, 414

[56] References Cited

U.S. PATENT DOCUMENTS

| | | | |
|---|---|---|---|
| 3,674,914 | 7/1972 | Burr | 361/409 X |
| 3,955,024 | 5/1976 | Goldman et al. | 174/68.5 X |
| 4,030,190 | 6/1977 | Varker | 174/68.5 X |
| 4,140,831 | 2/1979 | Miller | 174/68.5 X |
| 4,287,014 | 9/1981 | Gaku et al. | 174/68.5 X |
| 4,388,136 | 6/1983 | Huie | 174/68.5 X |
| 4,395,459 | 7/1983 | Herschdorfer et al. | 174/68.5 X |

Primary Examiner—R. R. Kucia
Attorney, Agent, or Firm—Mark Levy

[57] ABSTRACT

A high density dimensionally stable encapsulated circuit board and a method of making such a board is described. A curable adhesive is utilized to bond insulated wires to a substrate, the dimensional stability of which is maintained by a sheet of relatively thick copper foil. Since the adhesive is cured and since the copper foil returns to the same dimensions when thermally, mechanically or chemically cycled, the entire composite is dimensionally stable.

At each location where a connection is to be made to a wire, the wire has a non-linear geometrical portion. The increased dimensional stability plus non-linear shaped portion of the wires allows connections to be made to the board utilizing a very small drill. The result is a high density stable circuit board.

6 Claims, 6 Drawing Figures

HIGH DENSITY ENCAPSULATED WIRE CIRCUIT BOARD

CROSS REFERENCE TO RELATED APPLICATIONS (a) This application is a continuation-in-part of co-pending application Ser. No. 392,996 filed on June 28, 1982 for "High Density Encapsulated Wire Circuit Board", now abandoned.

(b) Patent application Ser. No. 392,998 entitled "Process for Making an Encapsulated Circuit Board and Products Made Thereby" by B. Grant, et al, filed on June 28, 1982 and assigned to the same assignee as this application, now U.S. Pat. No. 4,427,478, describes a method for making an encapsulated circuit board using a photo-curable adhesive.

(c) Co-pending application Ser. No. 392,997 entitled "Circuit Board Including Encapsulated Wires and Method of Making Such a Board" by John Shipley, et al, filed on June 28, 1982 and assigned to the same assignee as this application, describes a method for making an encapsulated circuit board using an improved photo-curable adhesive.

The inventions in the above applications (b) and (c) were made after the invention claimed in this application.

BACKGROUND OF THE INVENTION

1. Field of the Invention

This invention relates to electronic packaging and more particularly to an improved circuit board and an improved method of making circuit boards.

2. Background Art

There is a great deal of prior art directed to printed circuit boards and to processes for making printed circuit boards. The technology for making large high density printed circuit boards using plating techniques is well known. For example, see the introduction of U.S. Pat. No. 4,080,513 for a general summary of prior art in this area.

One of the problems encountered when fabricating high density circuit boards is the problem of precisely locating key features of the board after the board has passed through several steps in the fabrication process. For example, the location of circuit lands must be precisely known so that subsequent drilling steps can pass through these lands. Dimensional instability is a particularly severe problem when fabricating multilayer circuit boards which go through a series of laminating cycles. For example, U.S. Pat. No. 3,969,177 describes a technique for addressing this problem area. However, as the density and size of the boards being fabricated increases, the need for greater dimensional stability increases so that holes which are subsequently drilled in the board will intersect key features of the board such as lands in the circuit pattern thereby effecting an electrical connection to these features. If the board is not dimensionally stable, these drilled holes may miss the conductive pattern and the board will not function properly.

Most high density circuit boards use epoxy resin laminates which are reinforced with glass cloth. The glass cloth is included in order to provide strength. However, when the epoxy is softened as occurs during subsequent operations such as lamination, the glass cloth tends to move in an irregular and uncontrolled manner, thus the key features in the circuit pattern tend to move in an uncontrolled manner and these features can not be precisely located for subsequent drilling operations.

The technique described in U.S. Pat. No. 4,030,190 (Varker) seeks to eliminate this problem by using a relatively thick sheet of copper to impart dimensional stability instead of relying on the properties of the epoxy glass substrate for dimensional stability.

U.S. Pat. No. 4,030,190 (Varker) describes a sequential process for making multilayer circuit boards wherein dimensional stability is achieved during the manufacturing operation by building up the various layers of the board onto a substrate or base plane of copper which has a high degree of dimensional stability. A high density circuit board manufactured using this sequential technique is described in an article by D. P. Seraphim, entitled "A New Set of Printed Circuit Technologies for the IBM 3081 Processor", published in the IBM Journal of Research and Development, Vol. 26, No. 1, January 1982.

An alternative technique for manufacturing circuit boards involves laying down thin insulated wires on a substrate which has been coated with an adhesive. Holes are drilled into the board, cutting the wires at the places where connections are desired. These holes are plated, thereby making connections to the wires. Boards made by this process are generally termed encapsulated wire boards. One commercial application of this technology is known by the trade name "Multiwire" (trademark owned by Kollmorgen Corp). This type of technology is, for example, shown in U.S. Pat. Nos. 4,097,684 (Burr); 3,646,572 (Burr); 3,674,914 (Burr) and 3,674,602 (Keough).

SUMMARY OF THE INVENTION

The present invention provides a technique for making high density, thermally stable circuit boards using encapsulated wires. The invention combines in a synergistic manner the advantages of prior encapsulated wire or "Multiwire" technology with the technique for making high density dimensionally stable circuit boards shown in U.S. Pat. No. 4,030,190 (Varker).

The process of the present invention begins with a base layer of a dimensionally stable material such as copper. This base layer not only provides dimensional stability, but it can also serve as a power distribution or ground plane.

A composite is formed by laminating epoxy resin pre-preg onto each side of the copper foil. If more than one power or ground plane is desired, the composite can consist of a plurality of layers of copper foil separated from each other by layers of epoxy pre-preg and covered on the outside surfaces with epoxy pre-preg. This composite forms a core or backbone which has a high degree of dimensional stability. Since the pre-preg has very little dimensional stability, the dimensions of the composite during thermal, mechanical or chemical cycling are controlled by the dimensionally stable base layer of material such as copper.

A layer of thermally curable adhesive is applied on the outside of this composite. This adhesive must have two properties. The application of a relatively small amount of energy must soften it so that it can be selectively softened in order to affix wires to the composite. For reasons explained later, the adhesive must also have the property that it can be cured.

The insulated wires are laid down on the adhesive utilizing a wire feed head which softens the adhesive as the wire is being laid down on the adhesive. After the wiring head passes, the adhesive hardens; however, at this point the adhesive is not cured and if the board is thermally, mechanically or chemically cycled, the adhesive would soften and the wires would move relative to the copper foil.

To further aid in the fabrication of high density boards, at each location where a connection to a wire is desired, the wire is laid in the shape of a U or some other nonlinear geometric shape. The distance between the legs of the U is less than the diameter of the drill that is later used to drill holes in the board. The nonlinear geometric shape in the wire gives a greater landing area for the drill, that is, slight shifts in wire location or the drill location can occur and the drill will still encounter the wire.

After the wires have been laid in the adhesive the adhesive is cured, thereby fixing the wires to the dimensionally stable composite and preventing them from moving relative to the base composite. Since the dimensional changes of the base composite during thermal, mechanical or chemical cycling are controlled by the layer of copper and not by the layers of pre-preg, the wires move in predictable manner during any such cycling.

After the wires have been laid in the adhesive and the adhesive has been cured, holes are drilled at precise predetermined locations in the board. These holes are positioned to intersect the wires at particular locations. Next, these holes are catalyzed and plated, thereby making connections to the wires.

A multilayer structure can be formed by taking several composites which have had wires applied as described above, (but prior to drilling) separating them by layers of pre-preg and then laminating the structure into a high density multilayer encapsulated wire structure. In such a multilayer structure, the holes are dilled after the lamination step.

DESCRIPTION OF PREFERRED EMBODIMENT

Figure 1:
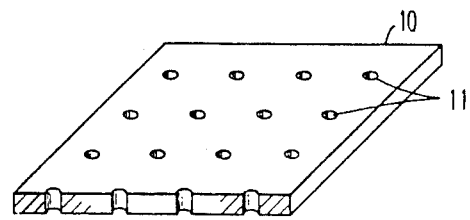
FIG. 1 illustrates a layer of copper foil showing the power clearance holes.

In the particular embodiment shown herein, the base element in the circuit board is a layer of two ounce copper foil 10 shown in FIG. 1. This base layer can be copper or any other dimensionally stable material. Boards made in accordance with this invention can include one or more such layers. The circuit described in detail herein has two such layers. The base layer 10 can serve as a ground or power plane for the circuit board. This layer of foil gives the circuit board dimensional stability. The thickness of this layer of foil relative to the thickness of subsequent layers of epoxy glass is chosen so that the expansion and contraction of the circuit board during thermal mechanical or chemical cycling is controlled by the properties of this layer. Clearance holes 11 are drilled in this foil at all locations where connections will be made to the encapsulated wires (except at the locations where it is desired to make connections between the encapsulated wires and the power or ground planes).

Figure 2:
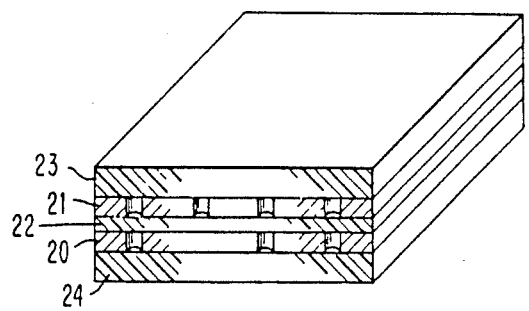
FIG. 2 illustrates a composite containing a plurality of power cores.

The particular embodiment shown here has a power plane 20 and a ground plane 21 in each composite as shown in FIG. 2. Power plane 20 and ground plane 21 are separated by a layer of epoxy resin pre-preg 22 and covered by layers of epoxy pre-preg 23 and 24. Epoxy resin pre-preg 22 23 and 24 is conventional pre-preg which consists of glass cloth impregnated with epoxy. The epoxy pre-preg can for example be formulated as shown in U.S. Pat. No. 4,024,305.

Figure 3:
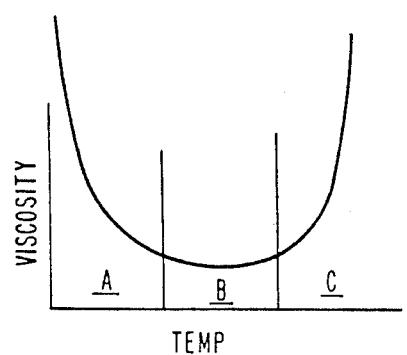
FIG. 3 illustrates the properties that the adhesive must have.
Figure 4:
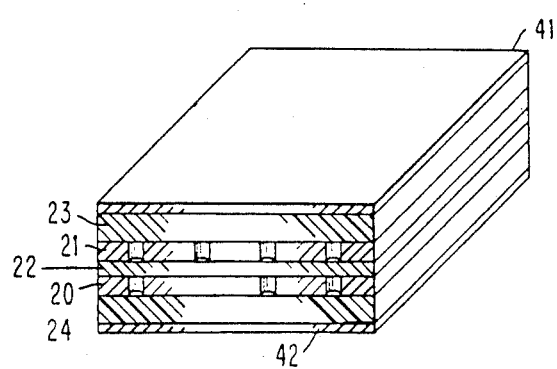
FIG. 4 illustrates a composite including the layers of adhesive.

The top and bottom layers of pre-preg 23 and 24 are covered with layers of adhesive 41 and 42 as shown in FIG. 4. The adhesive 41 and 42 has the properties shown in the viscosity versus temperature curve given in FIG. 3. This curve shows the viscosity of the adhesive as a constant amount of energy is applied. In region A the viscosity decreases. In region B the viscosity is low and in region C the material cures. One particular material that satisfies these requirements is an adhesive designated by the tradename FM238 which is manufactured by the Union Carbide company. Other adhesives which displays a similar viscosity versus temperature curve could be used.

It should also be understood that the adhesive composition in the preferred embodiment contains no polyester, nor is it fortified therewith, but is comprised of non-polyesteric material such as inorganic metallic film (e.g., inorganic mica). Stated affirmatively, the adhesive used in the present invention comprises material other than polyester.

Figure 5:
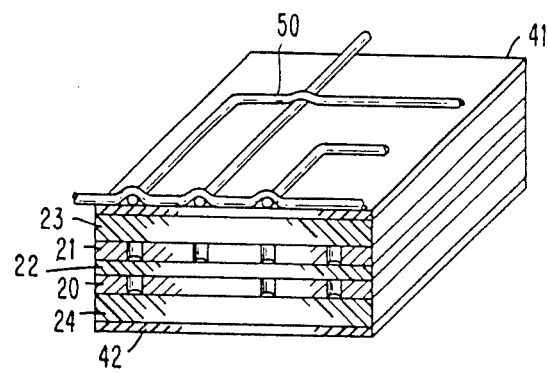
FIG. 5 illustrates a composite with wires applied.

The circuit wires are embedded in the adhesive as shown in FIG. 5. This can be done utilizing the type of equipment marketed by Kollmorgen Corporation for the fabrication of "Multiwire" boards. An example of such machinery is described in U.S. Pat. No. 3,674,914 (Burr).

After composites have been wired as shown in FIG. 5, if a multilayer board is desired several composites can be laminated together to form a multilayer board. The number of composites that can be laminated together is among other considerations limited by the ability to accurately drill small holes through the entire assembly.

Figure 6:
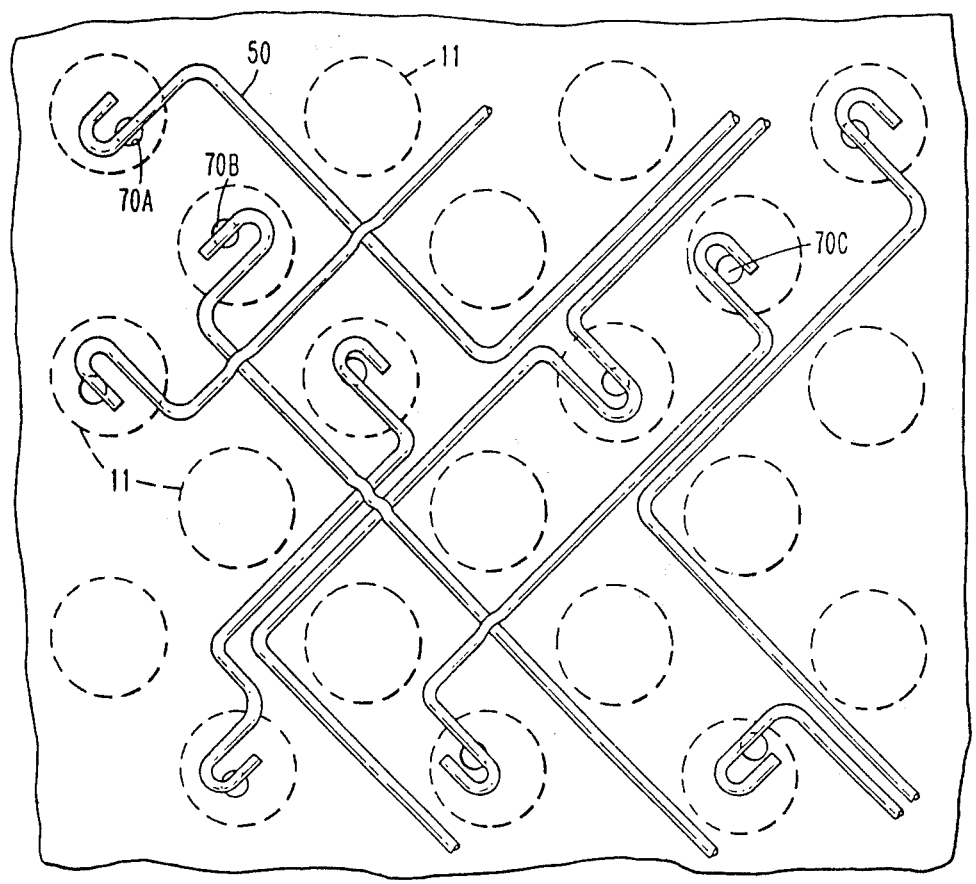
FIG. 6 shows U shapes in the wires and the relative sizes of the holes.

At each position where a connection is to be made to a wire 50, the wire is laid in the shape of a U. This is shown in FIG. 6. The center line of the wires that form the two legs of the U are separated by 15 mils.

Holes 70 are drilled as shown in FIG. 6 at each location where a connection is required to one of the encapsulated wires. The diameter of holes 70 is 18 mils. Since the legs of the U in the wires 50 is 15 mils, the drill has a relatively large area over which contact with a wire will me made. This is particularly important in a multilayer board where the drill may have to penetrate a relatively long distance before contacting a wire.

FIG. 6 shows in dotted lines the holes 11 in the power and ground planes 20 and 21. It is noted that the size of holes 11 is substantially bigger than the size of holes 70. This insures that there is adequate clearance. The large holes 70 can for example have a diameter of 50 mils whereas small holes 11 may have a diameter of 18 mils.

As shown by the location of holes 11A, 11B, 11C etc. the location of holes 11 due to the U shape in the wires 50 can vary and yet they will make contact with the wires 50. This U shape in the wire ends, allows for significantly increased density since it allows for the use of smaller wires without increasing the risk that a drill will miss encountering the wire. Likewise a smaller drill can be used without increasing the possibility of missing a wire. These factors combined allow one to space the wires 50 closer together. The combination of greater dimensional stability because the curable adhesive allows the the copper layer 10 to control the dimensional stability during thermal cycling together with the U shape in the wires at locations where holes will be drilled allows one to fabricate the high density circuit board of the present invention.

After the holes have been drilled as shown in FIG. 6, they are cleaned and catalyzed. This can for example be done using the cleaning technique shown in U.S. Pat. No. 4,155,755 and the catalyst shown in U.S. Pat. No. 4,066,809. After the holes are cleaned an catalyzed copper is plated in the holes utilizing the electroless bath described in U.S. Pat. No. 3,844,799. The copper plating makes connections to the wires in a conventional manner thereby completing the circuit board.

From the foregoing description, it can be seen that the circuit board fabrication is achieved by bonding curable adhesive material onto a more rigid layer that is soft enough to allow wires to be embedded therein, but yet can be thermally cured to maintain the desired dimensional stability. Moreover, rather than relying on a prior art principle of adhering partially cured polyester epoxy resin to fully cured polyester epoxy resin, the present invention provides a mechanical interlock between the copper layer or plate and the cured resin.

We have illustrated and described the preferred embodiment of the invention; however, it is to be understood that we do not limit ourselves to the precise construction herein disclosed and the right is reserved to all changes and modifications coming within the scope of the invention as defined by the appended claims.

I claim:

1. A circuit board comprising:
    a rigid base plane comprising a metallic layer which returns to a constant shape after being thermally cycled,
    a layer of epoxy glass cloth pre-preg covering said base plane, the thickness of said layer being such that its lateral movement during thermal cycling is controlled by said rigid base plane,
    a layer of curable adhesive covering said epoxy, said adhesive being other than polyester and having a viscosity curve which at first decreases due to the application of thermal energy and which later rises rapidly as the material cures,
    wires encapsulated in said adhesive which has been cured,
    whereby said wires are rigidly fixed to said rigid base plane and the movement of said wires during thermal cycling is controlled by said rigid base plane preventing unpredictable variations in the location of said wires due to non rigidity of said epoxy glass cloth pre-preg, and
    plated through holes making connections to said wires.

2. The circuit board recited in claim 1 wherein each wire has a non-linear shape at each location where a connection is to be made to the wire.

3. The encapsulated wire circuit board recited in claim 1 wherein said rigid base plane is comprised of copper foil.

4. The circuit board in accordance with claim 2 wherein said non-linear shape of each wire at each location where a connection is to be made to the wire is a U shape.

5. The circuit board in accordance with claim 4 wherein the diameter of each of said plated through holes is greater than the distance between the legs of said U shape.

6. A circuit board comprising:
    a rigid base plane comprising a metallic layer which returns to a constant shape after being cycled through forces capable of changing the board's dimensions,
    a layer of epoxy glass cloth pre-preg covering said base plane, the thickness of said layer being such that its lateral movement during said cycling is controlled by said rigid base plane,
    a layer of curable adhesive covering said epoxy, said adhesive comprising material other than a polyester and having a viscosity curve which at first decreases due to the application of thermal energy and which later rises rapidly as the material cures,
    wires encapsulated in said adhesive which has been cured,
    whereby said wires are rigidly fixed to said rigid base plane and the movement of said wires during said cycling is controlled by said rigid base plane preventing unpredictable variations in the location of said wires due to non rigidity of said epoxy glass cloth pre-preg, and
    plated through holes making connections to said wires.

* * * * *